United States Patent
Grayson et al.

(10) Patent No.: US 11,525,847 B2
(45) Date of Patent: Dec. 13, 2022

(54) SEEBECK CANCELLATION SWITCH FOR PRECISION DC VOLTAGE MEASUREMENTS

(71) Applicant: NORTHWESTERN UNIVERSITY, Evanston, IL (US)

(72) Inventors: Matthew Grayson, Evanston, IL (US); Chulin Wang, Evanston, IL (US); Juncen Li, Evanston, IL (US); William H. Reinhardt, Iowa City, IA (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 17/484,939

(22) Filed: Sep. 24, 2021

(65) Prior Publication Data
US 2022/0099711 A1 Mar. 31, 2022

Related U.S. Application Data

(60) Provisional application No. 63/083,530, filed on Sep. 25, 2020.

(51) Int. Cl.
*G01R 19/00* (2006.01)
*G01R 33/07* (2006.01)
*H01L 35/28* (2006.01)

(52) U.S. Cl.
CPC ....... *G01R 19/0084* (2013.01); *G01R 33/072* (2013.01); *H01L 35/28* (2013.01)

(58) Field of Classification Search
CPC .. G01R 19/00; G01R 19/0084; G01R 19/145; G01R 19/155; G01R 19/165;
(Continued)

(56) References Cited

U.S. PATENT DOCUMENTS 5,097,403 A * 3/1992 Smith ................... H02M 3/158
363/127
5,143,451 A * 9/1992 Millgard .................. G01K 7/02
374/25

(Continued)

FOREIGN PATENT DOCUMENTS

JP 2012228183 A * 11/2012 ............ C12M 41/46

*Primary Examiner* — Hoai-An D. Nguyen
(74) *Attorney, Agent, or Firm* — Benesch, Friedlander, Coplan & Aronoff LLP

(57) ABSTRACT

Systems and methods include an electrical switch that establishes a first electrical conducting path between terminals of an electrical measurement apparatus through one or more electrical leads and an electrically-conductive sample in a first state, and a second electrical conducting path between the terminals through the one or more electrical leads while bypassing the sample in a second state. A voltage $V_{S+L}$ is measured across all of the sample and the one or more electrical leads in the first state, while a voltage $V_L$ is measured across the one or more electrical leads while bypassing the sample in the second state. Calculations according to the equation $V_S = V_{S+L} - V_L$ are performed to determine a precision DC voltage measurement of a voltage across the sample $V_S$ in the absence of Seebeck voltage offsets contributed by the one or more electrical leads.

20 Claims, 10 Drawing Sheets

(58) Field of Classification Search
CPC ........ G01R 19/32; G01R 15/00; G01R 15/12;
G01R 15/14; G01R 15/144; G01R 33/00;
G01R 33/02; G01R 33/06; G01R 33/07;
G01R 33/072; H01L 35/00; H01L 35/28
See application file for complete search history.

(56) References Cited

U.S. PATENT DOCUMENTS

| | | | |
|---|---|---|---|
| 9,438,036 B2* | 9/2016 | Kaluzny | G05F 1/14 |
| 2013/0175959 A1* | 7/2013 | Fukuta | H03K 17/168 |
| | | | 318/400.27 |
| 2016/0216296 A1* | 7/2016 | Nakayama | G01R 15/202 |

* cited by examiner

SEEBECK CANCELLATION SWITCH FOR PRECISION DC VOLTAGE MEASUREMENTS

CROSS REFERENCE TO RELATED APPLICATIONS

The present application claims the benefit of priority under 35 U.S.C. § 119 from U.S. Provisional Patent Application Ser. No. 63/083,530, entitled "Seeback Cancellation Switch for Precision DC Voltage Measurements," filed on Sep. 25, 2020, the disclosure of which is hereby incorporated by reference in its entirety for all purposes.

STATEMENT OF FEDERALLY FUNDED RESEARCH OR SPONSORSHIP

This invention was made with government support under grant number FA9550-15-1-0377 and grant number FA9550-19-1-0410 awarded by the Air Force Office of Scientific Research (AFOSR). The government has certain rights in the invention.

TECHNICAL FIELD

The present disclosure generally relates to voltage measurement, and more specifically relates to Seebeck cancellation switches for precision DC voltage measurements.

BACKGROUND

In low voltage dc measurements, thermoelectric voltages generated by junctions of dissimilar metals at different temperatures are common sources of error.

The description provided in the background section should not be assumed to be prior art merely because it is mentioned in or associated with the background section. The background section may include information that describes one or more aspects of the subject technology.

SUMMARY

According to certain aspects of the present disclosure, an exemplary system for performing precision DC voltage measurements includes an electrically-conductive switch operable to switch between a first mode that provides a conducting path between a port a and a port b, to a second mode that provides a conducting path between the port a and a port c, based on a value of a control input $V_G$ being in a HIGH state or a LOW state, respectively. The system also includes a measurement apparatus operable to perform voltage measurements across an electrically-conductive sample electrically connected with one or more sample leads between the port a and the port b of the switch, a positive terminal of the measurement apparatus electrically coupled to the port c of the switch via one or more first measurement leads, and a negative terminal of the measurement apparatus electrically coupled to the port b of the switch via one or more second measurement leads. The system further includes an electronic controller device operable to alternately set the control input $V_G$ of the switch into the HIGH state and the LOW state. The electronic controller device is also operable to synchronize timing of setting the control input $V_G$ with corresponding voltage measurements performed by the measurement apparatus to measure voltages across its terminals. The voltage measurements include a voltage $V_{S+L}$ across all of the sample and the one or more first measurement leads, the one or more second measurement leads, and/or the one or more sample leads when the control input $V_G$ is in the HIGH state. The voltage measurements also include a voltage $V_L$ across the one or more first measurement leads, the one or more second measurement leads, and/or the one or more sample leads when the control input $V_G$ is in the LOW state. The system performs calculations according to the equation $V_S = V_{S+L} - V_L$ to determine a precision DC voltage measurement of a voltage across the sample $V_S$ in the absence of Seebeck voltage offsets contributed by the one or more first measurement leads, the one or more second measurement leads, and/or the one or more sample leads between the measurement apparatus and the sample.

The electrically-conductive switch may include a p-type MOSFET and an n-type MOSFET having their respective drains electrically connected together and to the port c. The source of the n-type MOSFET may be electrically connected to the port a, and the source of the p-type MOSFET may be electrically connected to the port b, while the gates of the n-type MOSFET and p-type MOSFET may be electrically connected together and to the control input $V_G$.

The system may include a control voltage source electrically connected to the control input $V_G$. The control voltage source may be controllable by the electronic controller device to set the control input $V_G$ to a LOW state or a HIGH state.

The HIGH state may correspond to a voltage value between a minimum positive value and a maximum positive value corresponding to an operational range of an n-channel enhancement mode MOSFET device.

The LOW state may correspond to a voltage value between a maximum negative value and a minimum negative value corresponding to an operational range of a p-channel enhancement mode MOSFET device.

The HIGH state may correspond to a voltage value between a threshold positive value and a maximum positive value corresponding to an operational range of an n-channel depletion mode MOSFET device.

The LOW state may correspond to a voltage value between a zero value and a threshold positive value corresponding to an operational range of a p-channel enhancement mode MOSFET device.

The electrically-conductive switch may include an integrated circuit mounted on a silicon substrate and positionable proximate to the electrically-conductive sample.

According to certain aspects of the present disclosure, an exemplary system for performing precision DC voltage measurements includes a transistor switch having a PMOS transistor and an NMOS transistor. The drain of the NMOS transistor is electrically connected to the drain of the PMOS transistor and a port c of the switch. The source of the NMOS transistor is electrically connected to a port a of the switch. The source of the PMOS transistor is electrically connected to a port b of the switch. The gates of both the NMOS transistor and the PMOS transistor are electrically connected to a control input of the switch. The system also includes a measurement apparatus remotely controllable by a computing device to perform voltage measurements across an electrically conductive sample that is electrically connected with one or more sample leads between the port a and the port b of the switch, a positive terminal of the measurement apparatus electrically coupled to the port c of the switch via one or more first measurement leads, and a negative terminal of the measurement apparatus electrically coupled to the port b of the switch via one or more second measurement leads. The system also includes a non-transitory computer-readable memory comprising instructions, and a computing processor configured to execute the instructions which, when executed, cause the processor to perform the following operations. Alternately set the control input $V_G$ of the switch into a HIGH state and a LOW state. Synchronize timing of setting the control input $V_G$ with corresponding voltage measurements performed by the measurement apparatus to measure: a voltage $V_{S+L}$ across all of the sample and the one or more first measurement leads, the one or more second measurement leads, and/or the one or more sample leads when the control input $V_G$ is in the HIGH state; and a voltage $V_L$ across the one or more first measurement leads, the one or more second measurement leads, and/or the one or more sample leads when the control input $V_G$ is in the LOW state. Perform calculations according to the equation $V_S=V_{S+L}-V_L$ to determine a precision DC voltage measurement of a voltage across the sample $V_S$ in the absence of Seebeck voltage offsets contributed by the one or more first measurement leads, the one or more second measurement leads, and/or the one or more sample leads between the measurement apparatus and the sample.

The system may also include a control voltage source electrically connected to the control input $V_G$. The control voltage source may be controllable by the electronic controller device to set the control input $V_G$ to a LOW state or a HIGH state.

The HIGH state may correspond to a voltage value between a minimum positive value and a maximum positive value corresponding to an operational range of the NMOS device. The LOW state may correspond to a voltage value between a maximum negative value and a minimum negative value corresponding to an operational range of the PMOS device.

The HIGH state may correspond to a voltage value between a threshold positive value and a maximum positive value corresponding to an operational range of the NMOS device. The LOW state may correspond to a voltage value between a zero value and a threshold positive value corresponding to an operational range of the PMOS device.

The transistor switch may include an integrated circuit mounted on a silicon substrate and positionable proximate to the electrically-conductive sample.

According to certain aspects of the present disclosure, an exemplary method for performing precision DC voltage measurements includes setting a control input $V_G$ of an electrical switch into a HIGH state that establishes a first electrical conducting path from a positive terminal of an electrical measurement apparatus through one or more electrical leads and an electrically-conductive sample to a negative terminal of the electrical measurement apparatus. The method includes, while the control input $V_G$ of the switch is in the HIGH state, measuring a voltage $V_{S+L}$ across all of the sample and the one or more electrical leads. The method also includes setting the control input $V_G$ of the switch into a LOW state that establishes a second electrical conducting path from the positive terminal of an electrical measurement apparatus through the one or more electrical leads to the negative terminal of the electrical measurement apparatus bypassing the sample. The method further includes, while the control input $V_G$ of the switch is in the LOW state, measuring a voltage $V_L$ across the one or more electrical leads. The method additionally includes performing calculations according to the equation $V_S=V_{S+L}-V_L$ to determine a precision DC voltage measurement of a voltage across the sample $V_S$ in the absence of Seebeck voltage offsets contributed by the one or more electrical leads.

The measuring the voltage $V_{S+L}$ and the measuring the voltage $V_L$ may be performed by a voltmeter and may include storing the measured voltage $V_{S+L}$ and the measured voltage $V_L$ in a memory, respectively.

Performing the calculations according to the equation $V_S=V_{S+L}-V_L$ may include retrieving the measured voltage values $V_{S+L}$ and $V_L$ from a memory prior to performing the calculations.

Setting the control input $V_G$ of the electrical switch into a HIGH state may include setting the gates of both a PMOS transistor and an NMOS transistor to a voltage value $V_G$ corresponding to the HIGH state, thereby creating an electrical conduction path through an n-channel of the NMOS transistor between the electrical measurement apparatus and the electrically-conductive sample.

Setting the control input $V_G$ of the electrical switch into a LOW state may include setting the gates of both a p-channel MOSFET and an n-channel MOSFET to a voltage value $V_G$ corresponding to the LOW state, thereby creating an electrical conduction path through a p-channel of the p-channel MOSFET between the positive terminal and the negative terminal of the electrical measurement apparatus bypassing the electrically-conductive sample.

The method may also include positioning the electrical switch proximate the electrically-conductive sample and at a same temperature as the electrically-conductive sample.

The method may include characterizing the sample as a thermoelectric material in a cryostat by applying a local temperature gradient to the sample while positioned inside the cryostat and measuring proportionally induced voltage.

The method may include measuring the Hall effect of an electronic material as the sample.

The method may include characterizing nonlinear current-voltage characteristics for an electronic device as the sample.

According to certain aspects of the present disclosure, a system may be provided for performing the method for remotely allocating bandwidth among content consumers on a computing network. The system may include a memory storing instructions and a processor configured to execute the instructions. The stored instructions may, when executed, cause the processor to perform the method for remotely allocating bandwidth among content consumers on the computing network.

According to certain aspects of the present disclosure, a non-transitory machine-readable storage medium having instructions stored thereon for causing a processor to execute the method for remotely allocating bandwidth among content consumers on a computing network may be provided.

BRIEF DESCRIPTION OF DRAWINGS

The disclosure is better understood with reference to the following drawings and description. The elements in the figures are not necessarily to scale, emphasis instead being placed upon illustrating the principles of the disclosure. Moreover, in the figures, like-referenced numerals may designate to corresponding parts throughout the different views.

Figure 1:
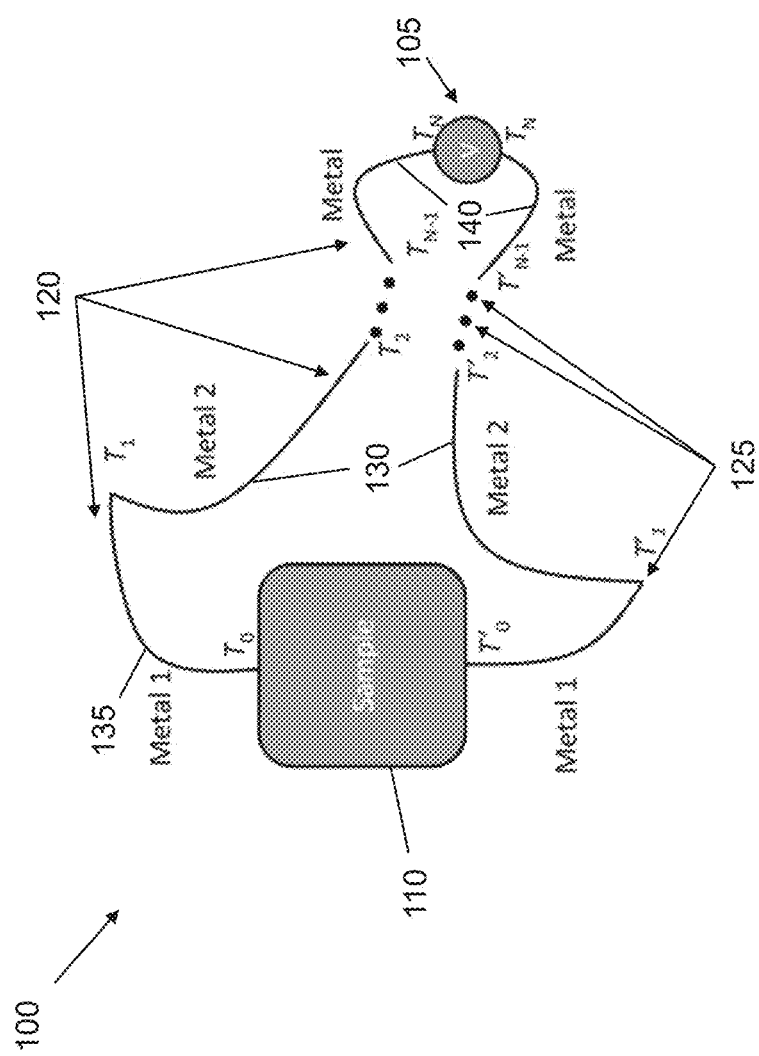
FIG. 1 illustrates a typical experimental apparatus in which a measurement apparatus measures a voltage of interest of a sample under study that is seated on a test jig, via electrical leads that include a series of junctions connecting the sample under study to the measurement apparatus.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Precision dc voltage measurements of devices, for example, inside cryostats or thermostats, whose sample-under-test is at a different temperature than the laboratory measurement apparatus are challenging. When making precision dc voltage measurements in cryostats or thermostats, undesirable thermoelectric voltages are typically generated along the electrical leads between the measurement apparatus and the sample wherever the lead contains junctions of dissimilar metals at different temperatures. In a typical measurement, several such junctions are common along each lead, and thus a dc or slowly varying thermoelectric offset signal in the leads will add to the measured circuit voltage, thereby resulting in measurement error. This effect may be especially detrimental in low-level voltage measurements. Prior to the present disclosed technologies, existing techniques to minimize these thermoelectric offsets are laborious, expensive, and cumbersome. The technologies disclosed herein include an electrically controlled switch inside the cryostat or thermostat that facilitates a spurious thermoelectric voltage offset to be calibrated and cancelled. The technologies disclosed herein provide an all-electrical method for obtaining high-fidelity low-level dc voltage signals.

The technologies disclosed herein have numerous practical applications, including, but not limited to:
  Low-level dc voltage measurement inside cryostats and/or thermostats
  Small temperature difference measurements inside cryostats and/or thermostats
  Temperature-dependent Seebeck measurements for different materials inside cryostats and/or thermostats
  dc Hall voltage measurements inside cryostats and/or thermostats The technologies disclosed herein have numerous advantages, including, but not limited to:
  Easy-to-implement all-electrical calibration method
  Scalably small (e.g., chip-level) implementation
  No modification of standard cryostat/thermostat design needed, as there may only be one extra wire feed-through compared to prior systems
  Can be implemented with existing commercial silicon integrated circuit technology Standard dc voltage measurements of a sample under study are typically performed by a measurement apparatus by analyzing a signal that passes through electrical leads that connect the measurement apparatus to the sample. Although the leads are normally assumed to not contribute to the signal, an additional dc offset may arise in the leads due to a thermoelectric voltage. The technologies disclosed herein include an apparatus and a method for characterizing and eliminating unwanted contributions to dc voltage measurements in order to obtain high fidelity measurements of the low voltage signal. In this report, the capabilities of our Seebeck cancellation switch are demonstrated. The technologies disclosed herein utilize an electrically-controlled switching element (e.g., transistor) that is located next to the sample to switch between measurement circuits that either include or exclude the sample under study. By determining the difference between measured voltages associated with each of these measurement circuits, the voltage across the sample, independent of any thermoelectric offset voltages present in the leads, may be deduced.

FIG. 1 illustrates a typical experimental apparatus 100 in which a measurement apparatus 105 measures a voltage of interest of a sample under study 110, via electrical leads 120 that include a series of junctions 125 connecting the sample under study 110 to the measurement apparatus 105. For typical dc voltage measurements of electrical node(s) in the sample 110, the sample 110 is connected through the leads 120 to a voltmeter (e.g., a type of measurement apparatus 105). In most cases as illustrated in FIG. 1, the leads 120 include a series of junctions 125 between various electrical conductors that attach to the measurement apparatus 105, for example, wires 130 made of Metal 2 (e.g., copper wires), traces or lines 135 made of Metal 1 (e.g., gold traces or lines), and test cables 140 (e.g., twisted wires, braided wires, and/or shielded transmission lines made of some Metal) where different wires 130, lines 135, and/or cables 140 in the experimental apparatus 100 are soldered and/or otherwise fused in series. In cryostats and thermostats, for example, each of these junctions 125 may reside at a different temperature $T_i$ or $T'_i$ where i ranges from 0 to N. The measurement circuit not including the sample 110, denoted as the 'leads 120' of the system, may have a thermoelectric voltage contribution $V_L$ that may be represented as $V_L = \sum_{i=1}^{N-1} (S_{i+1} - S_i)(T_i - T_i')$. Denoting the voltage of interest of the sample 110 as $V_S$, the measured voltage may be denoted as the sum of the sample voltage and thermoelectric voltage $V_{S+L} = V_S + V_L$. In an experiment, it may be quite difficult to accurately determine the dc offset contribution of $V_L$ to $V_{S+L}$, and it may also require excessive expense and effort to create an optimized experimental apparatus where this voltage $V_L$ is negligible when high precision is needed in the measurement results. The technologies disclosed herein facilitate a more efficient and effective solution to achieving high precision in measurement results.

Figure 2:
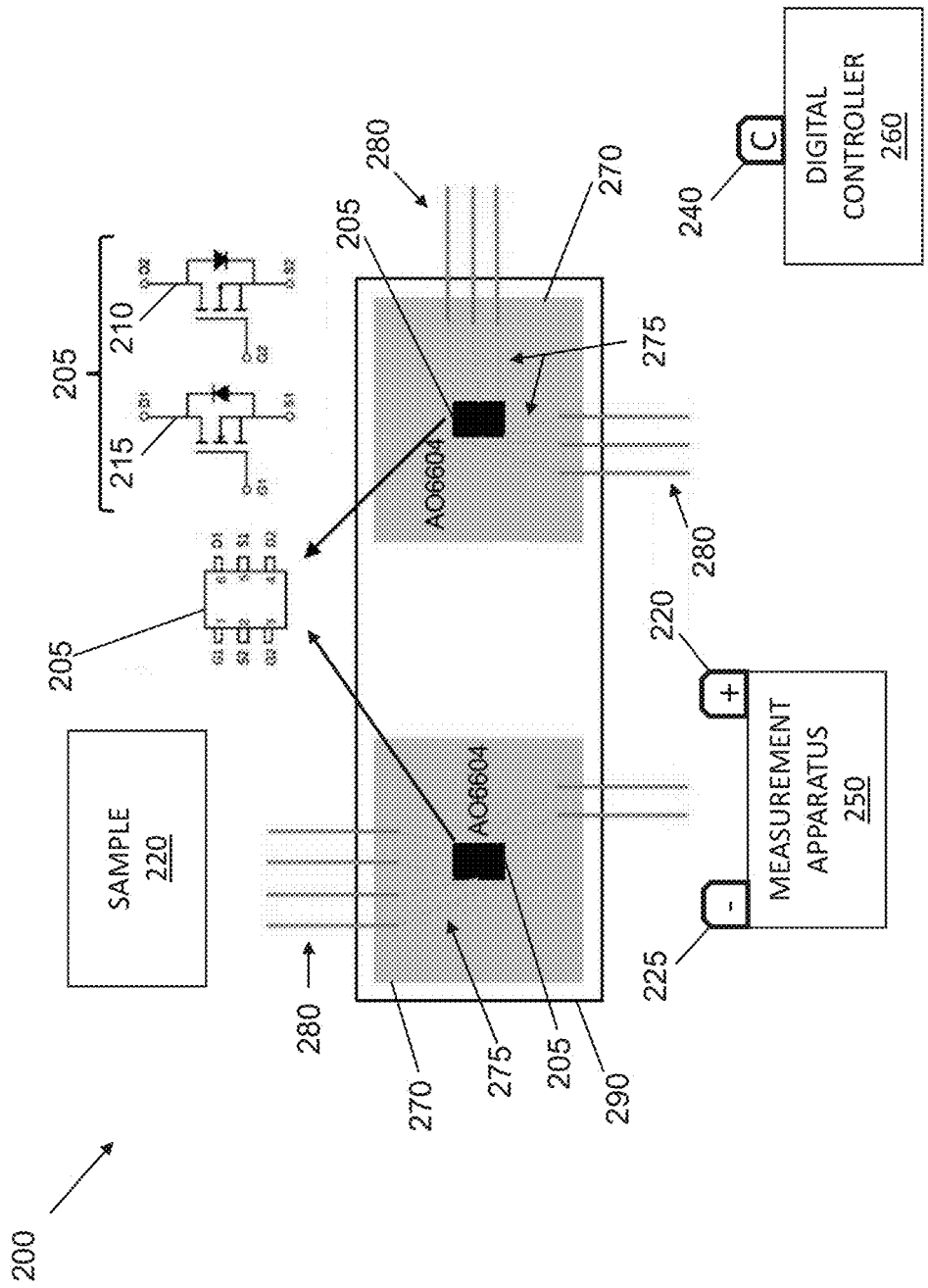
FIG. 2 illustrates an exemplary experimental apparatus including a transistor switch having a p-type MOSFET and an n-type MOSFET located near a sample under study.

FIG. 2 illustrates an exemplary experimental apparatus 200 including a transistor switch 205 having a p-type MOSFET 210 and an n-type MOSFET 215 located near a sample under study 220. In a nonlimiting example, the MOSFETs 210 and 215 may be included in an integrated circuit (IC) package (e.g., an AO6604 product from ALPHA & OMEGA SEMICONDUCTOR) having pins to connect the MOSFETs 210 and 215 with leads going to each of a sample under study 220 and a measurement apparatus 250. The transistor switch 205 may be controlled by a digital controller 260 to switch between two states based on whether the digital controller 260 provides a LOW value or a HIGH value as a control signal 240 to the transistor switch 205: 1) a measurement calibration state in which a positive input 220 and a negative input 225 of the measurement apparatus 250 connect through and measure a leads pathway between the measurement apparatus 250 and the transistor switch 205, and 2) a sample measurement state in which the positive input 220 and the negative input 225 of the measurement apparatus 250 connect through and measure a leads pathway between the measurement apparatus 250, the transistor switch 205, and also the sample under study 220.

Figure 3:
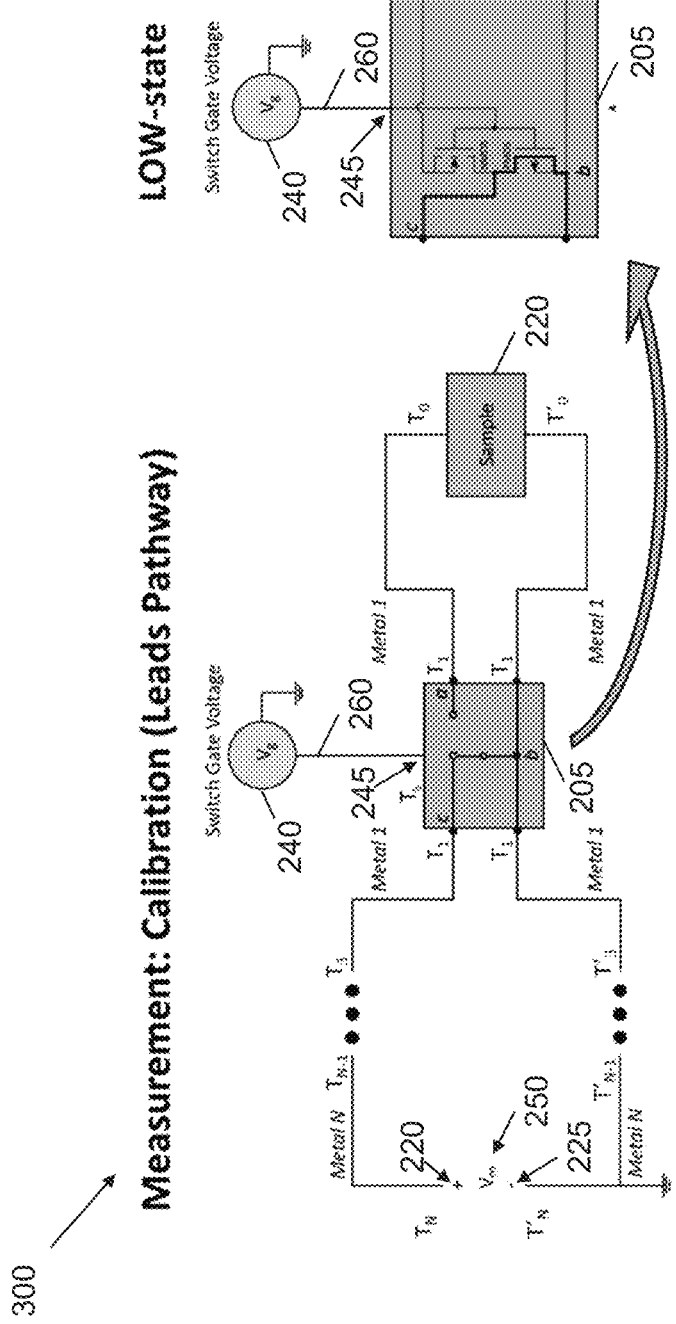
FIG. 3 illustrates an exemplary circuit diagram of the measurement apparatus connected to the sample under study via the transistor switch in a measurement calibration state.
Figure 4:
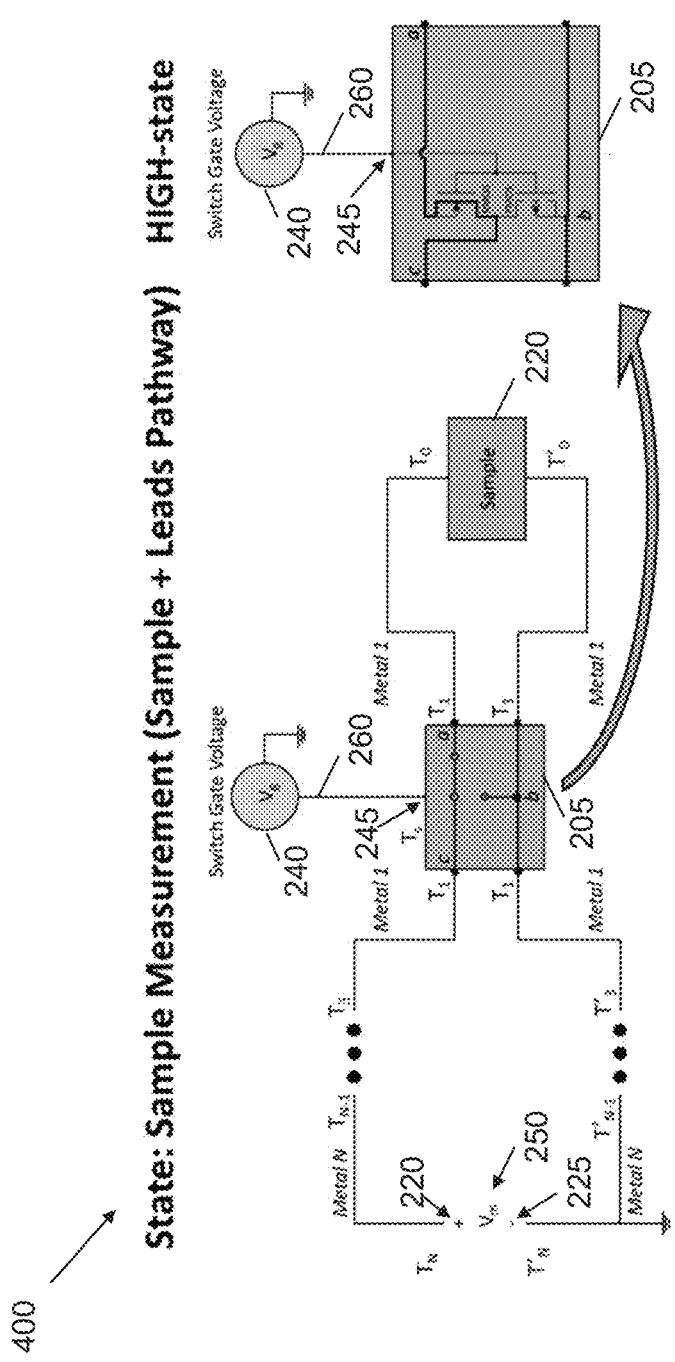
FIG. 4 illustrates an exemplary circuit diagram of the measurement apparatus connected to the sample under study via the transistor switch in a sample measurement state.

FIG. 3 illustrates an exemplary circuit diagram of the measurement apparatus 250 connected to the sample under study 220 via the transistor switch 205 in a measurement calibration state. FIG. 4 illustrates an exemplary circuit diagram of the measurement apparatus 250 connected to the sample under study 220 via the transistor switch 205 in a sample measurement state. As shown in the circuit diagram in FIG. 3, a LOW value signal 260 on the gate input 245 (G1, G2) of the transistor switch 205 turns on the p-type MOSFET 210 thereby shorting terminals b (S2) and c (D2) while turning off the n-type MOSFET 215. In the LOW state, the 'leads' of the experimental apparatus 200 may be measured, with the resulting measured voltage representing the sum of all of the thermoelectric voltages $V_L$. As shown in the circuit diagram in FIG. 4, when a HIGH value signal 260 is applied to the gate input 245 (G1, G2) of the transistor switch 205, the n-type MOSFET 215 is turned on and shorts terminals a (S1) and c (D1), while the p-type MOSFET 210 is turned off. In this configuration of FIG. 4, both the 'leads' and the sample under study 220 may be measured by the measurement apparatus 250 to determine $V_{S+L}$. Combining the measurement results from both configurations shown in FIG. 3 and FIG. 4, the sample voltage may be determined as $V_S = V_{S+L} - V_L$.

The small size of the transistor switch 205 facilitates it being inserted into the measurement circuit along with the sample under study 220, in a location where it may be at the same temperature as the sample 220, and switched at the rate of measurement data collection. As a result of its small size and simplicity, this design of the transistor switch 205 may be integrated into almost any electrical measurement configuration. Additionally, thermal shielding may be straightforwardly added to the transistor switch 205 to make it relatively isothermal, since temperature variation between terminals a, b, and c would be the only remaining source of potentially nonnegligible thermoelectric error. This may prevent additional Seebeck voltages from being generated on the transistor switch 205 and further improve the accuracy of the measurements taken using the experimental apparatus 200 to extreme precision.

Figure 5:
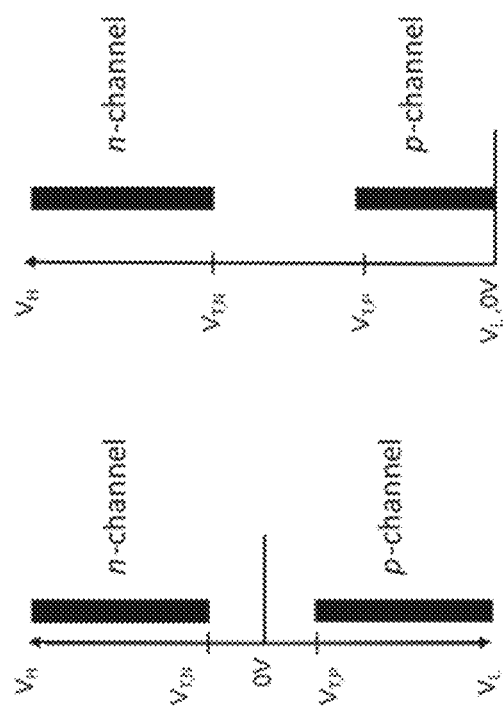
FIG. 5A illustrates an exemplary bipolar operational voltage configuration for the transistor switch.
FIG. 5B illustrates an exemplary unipolar operational voltage configuration for the transistor switch.

FIG. 5A illustrates an exemplary bipolar operational voltage configuration for the transistor switch 205. FIG. 5B illustrates an exemplary unipolar operational voltage configuration for the transistor switch 205. The operational switch voltages for the HIGH or LOW states may either be bipolar (meaning that HIGH state corresponds to a positive voltage and LOW state corresponds to a negative voltage) as shown in FIG. 5A, or unipolar (meaning that HIGH and LOW states both correspond to voltage values having the same polarity, e.g., positive or negative voltage) as shown in FIG. 5B. While a typical CMOS inverter circuit may be reconfigured to serve as a bipolar Seebeck cancellation switch, a unipolar switch may also be straightforwardly constructed from standard p- and n-type complementary transistors. An example of a bipolar device may be made from a p-channel enhancement mode MOSFET and an n-channel enhancement mode MOSFET (see FIG. 5A). An example of a unipolar device with both HIGH and LOW states having positive voltage may be made from a p-channel depletion mode MOSFET and an n-channel enhancement mode MOSFET (see FIG. 5B). A unipolar device with both HIGH and LOW states having negative voltage may be made from a p-channel enhancement mode MOSFET and an n-channel depletion mode MOSFET (not shown). The y-axes of FIGS. 5A and 5B represent the gate-voltage input (G1, G2) of the CMOS circuit, and the vertical black bars indicate the voltage ranges where each respective transistor channel is "on." The p- and n-channel thresholds are indicated with the subscripts $V_{T,P}$ and $V_{T,N}$, respectively, while $V_H$ represents the maximum voltage corresponding to the HIGH state and $V_L$ represents the minimum voltage corresponding to the LOW state.

Experiments have verified the functionality of the transistor switch 205 as part of the experimental apparatuses 200, 300, 400 discussed in this disclosure. The experimental apparatus 200, 300, 400 facilitates generation of thermoelectric voltages in the measurement circuit (e.g., the 'leads') and canceling them out by subtracting a voltage measurement taken without the sample in the measurement circuit from a voltage measurement taken with the sample in the measurement circuit. The sample under study 220 in these experiments was designed to artificially generate a small voltage signal on the order of tens (10's) of microvolts (typical for Seebeck measurements) and have a sample equivalent output impedance of 10Ω (typical for Seebeck samples). The experimental measurement results show that the transistor switch 205 functions in the experimental apparatuses 200, 300, 400 as intended, and is able to subtract out thermoelectric voltages in the measurement system.

In a laboratory implementation of the experimental apparatus 200 as illustrated in FIG. 2, the AO6604 complementary MOSFET was used to experimentally prove the concept of an in-situ thermoelectric cancellation device for accurate low voltage DC measurement. The AO6604, which includes independent n-type and p-type MOSFETs, was mounted with thermal epoxy on a silicon wafer 270. Gold wires 275 were soldered to the pins (G1, G2, S1, S2, D1, D2) of the AO6604 chip and then connected to epoxied copper wires 280 using indium. The silicon wafer 270 was cut and mounted on a glass slide 290, one square of the silicon wafer 270 for each of two specimens of the AO6604 chip. The copper wires 280 were epoxied to the glass slide 290.

Figure 6:
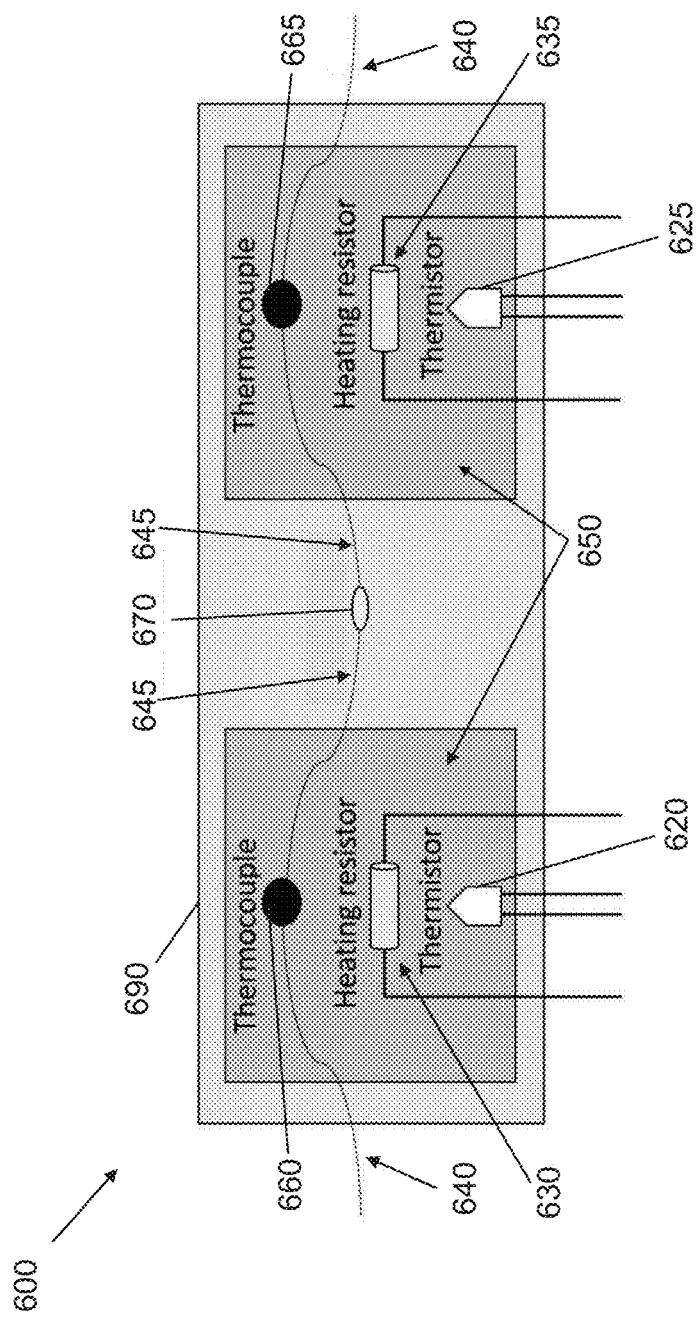
FIG. 6 illustrates an exemplary thermocouple junction as an example of the sample under study that was used to experimentally demonstrate operation of the experimental apparatus illustrated in FIG. 2.

FIG. 6 illustrates an exemplary thermocouple junction 600 as an example of the sample under study 220 that was used to experimentally demonstrate operation of the experimental apparatus 200. The thermocouple junction 600 was created to experimentally generate thermoelectric voltages in the circuit. The thermocouple junction 600 includes a glass slide 690 on which two squares of silicon wafer 650 are mounted with normal epoxy. On each square of silicon wafer 650 are mounted a thermistor 620, 625, a heating resistor 630, 635, and a thermocouple 660, 665 using thermal epoxy. Wires of a first metal type 640 are connected to each of the thermocouples 660, 665 for external connections (e.g., to the transistor switch 205). Wires of a second metal type 645 connect each of the thermocouples 660, 665 to a solder joint 670 that joins the two wires 645.

The thermocouple junction 600 was tested as an example of the sample under study 220 in an experimental demonstration of the experimental apparatus 200 including the transistor switch 205. The thermocouple junction 600 is used to simulate thermoelectric voltages that would be encountered in a cryostat or thermostat measurement system where the temperature of the sample under study 220 is different from the temperature of the electrical output leads in the laboratory. Such thermoelectric voltages, called the Seebeck effect, may arise at the junctions between dissimilar metals in the electrical leads that span the length of the thermostat/cryostat. If the temperatures of the solder joints on the forward line are not exactly equal to the corresponding temperatures on the return line, or if there is any minor variation of alloy composition or wire thickness along the length of the wire, then the forward and return lines may not cancel, thereby inducing a net Seebeck voltage in the leads themselves.

The strategy behind the Seebeck cancellation switch (transistor switch 205) is that the thermoelectric voltages in the circuit may be calibrated out by switching between the voltage due to the leads alone ('leads'), and the voltage due to both the sample and the leads ('sample+leads') with transistors located at or near the sample which operate at the sample temperature. In FIG. 6, the layout of the thermocouple junction 600 as an example of the sample under study 220 of the experimental apparatus 200 is shown. The thermocouple junction 600 is intended to simulate one of the measurement leads, consisting of two junctions between two dissimilar metals 640, 645, two thermocouples 660, 665, set deliberately at different temperatures to induce the expected Seebeck voltage that is to be cancelled out. To construct this section, two pieces of silicon 650 are mounted to a glass slide 690. Then, using thermal epoxy, a resistor 630, 635 is placed on each of the pieces of silicon 650 and connected to a power supply (not shown) to act as a heater operating at a heater voltage $V_h$. In order to accurately track the effects of the heating, a thermistor 620, 625 is also placed on each piece of silicon 650 to provide accurate temperature readings labelled $T_{TC1}$ and $T_{TC2}$. A thermocouple 660, 665 is attached to each piece of silicon 650, and then the thermocouples 660, 665 are connected to one another by soldering together two legs made up of the same metal type 645. By heating up one of the heating resistors 620, 625, a temperature difference may be generated across the junctions leading to generation of a corresponding Seebeck voltage.

Figure 7:
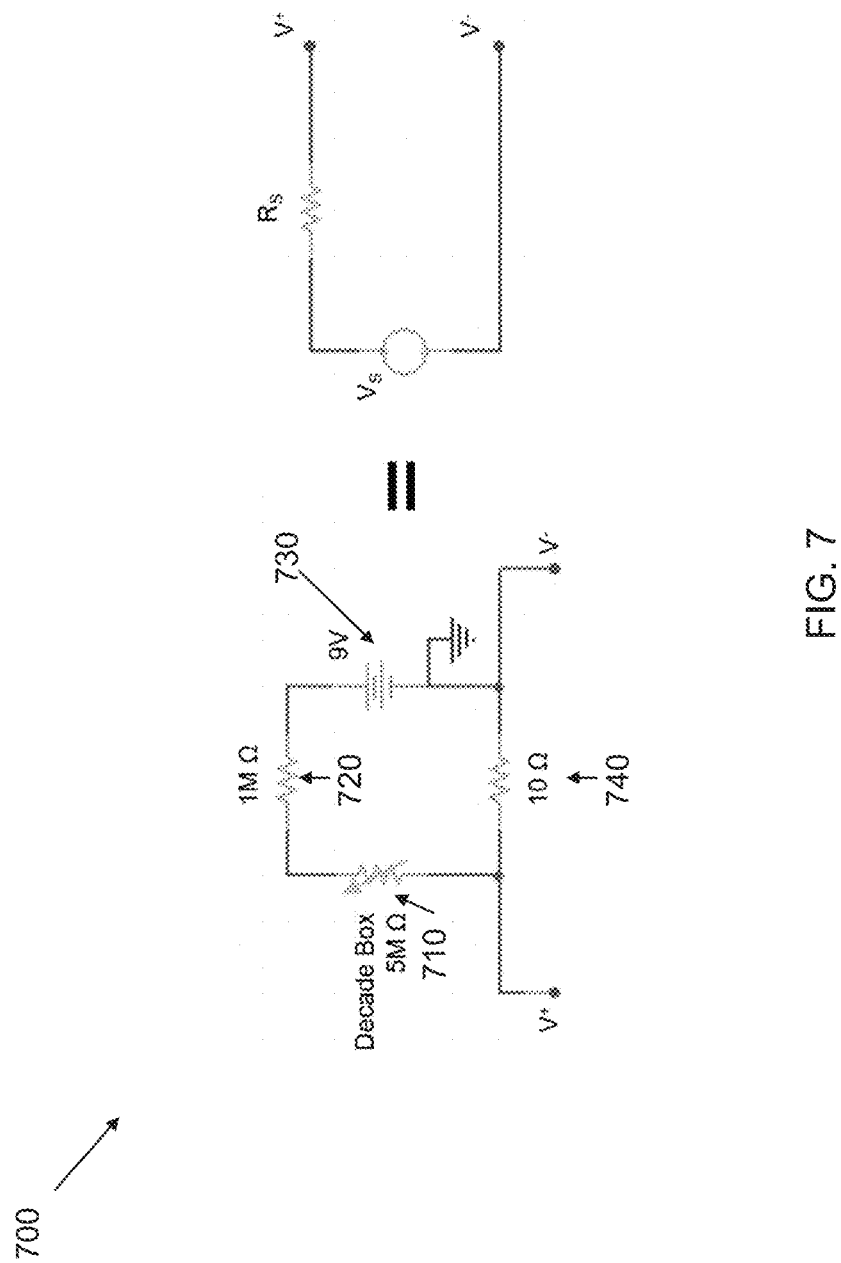
FIG. 7 illustrates an exemplary circuit schematic of a mock sample used in experimental demonstrations of the experimental apparatus of FIG. 2.

FIG. 7 illustrates an exemplary circuit schematic of a mock sample 700 used in experimental demonstrations of the experimental apparatus 200. The mock sample 700 may generate a voltage signal $V_S$ on the order of tens (10's) of microvolts, which is typical for Seebeck measurements, with a sample equivalent output impedance $R_S$ of ten ohms (10Ω), which is also typical of Seebeck samples. The mock sample 700 includes a 5 MΩ decade box 710 providing a positive output voltage terminal V⁺ and connected through a 1 MΩ resistor 720 to a positive terminal of a 9V voltage source 730. The negative terminal of the 9V voltage source 730 is set as the reference ground and serves as the negative output voltage terminal V⁻ of the mock sample 700. A 10Ω resistor 740 is coupled between the positive V⁺ and negative V⁻ output terminals of the mock sample 700.

Figure 8:
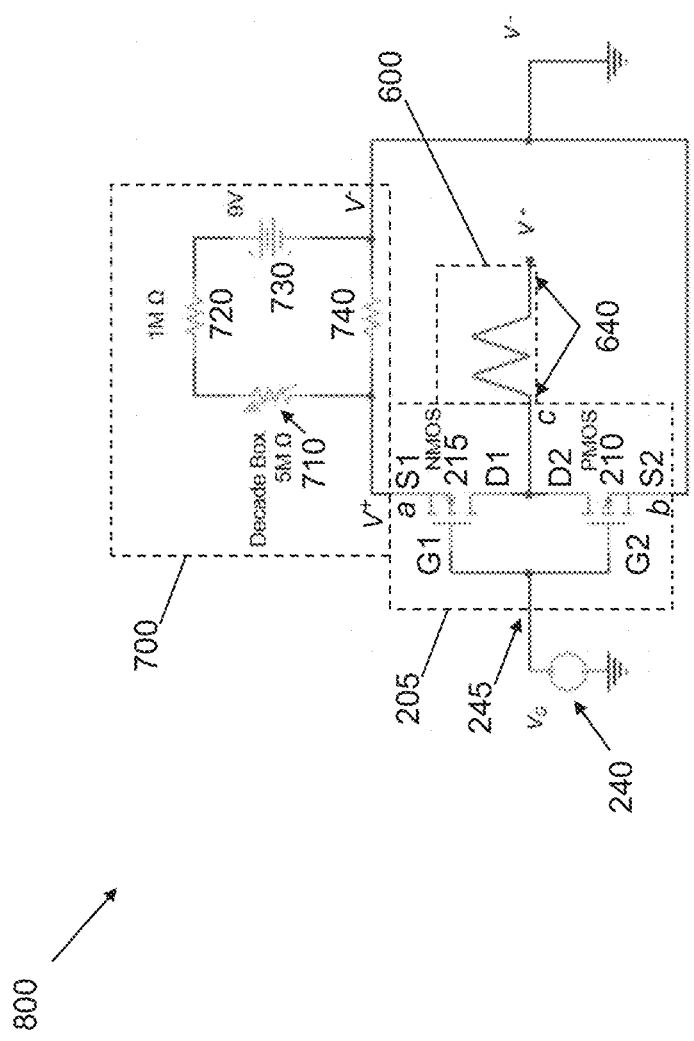
FIG. 8 illustrates an exemplary circuit schematic of a completed circuit for experimental demonstration of the experimental apparatus of FIG. 2.

FIG. 8 illustrates an exemplary circuit schematic of a completed circuit 800 for experimental demonstration of the experimental apparatus 200. The completed circuit 800 includes the thermocouple junction 600, the transistor switch 205 including the PMOS and NMOS channels from the AO6604 chip, a gate voltage $V_G$ generator 240, and the mock sample 700. Switching the gate voltage $V_G$ to either LOW or HIGH may effectively choose between the "leads" and "sample+leads" pathways, respectively.

To experimentally demonstrate the switching and Seebeck cancellation capabilities of the technologies described herein, resistance and voltage measurements were taken over the mock sample 700 at various gate voltage $V_G$ values. These experimentally measured resistance and voltage values were then analyzed and compared to theoretical values to ensure the technologies described herein were able to correctly cancel out thermoelectric voltages.

Figure 9:
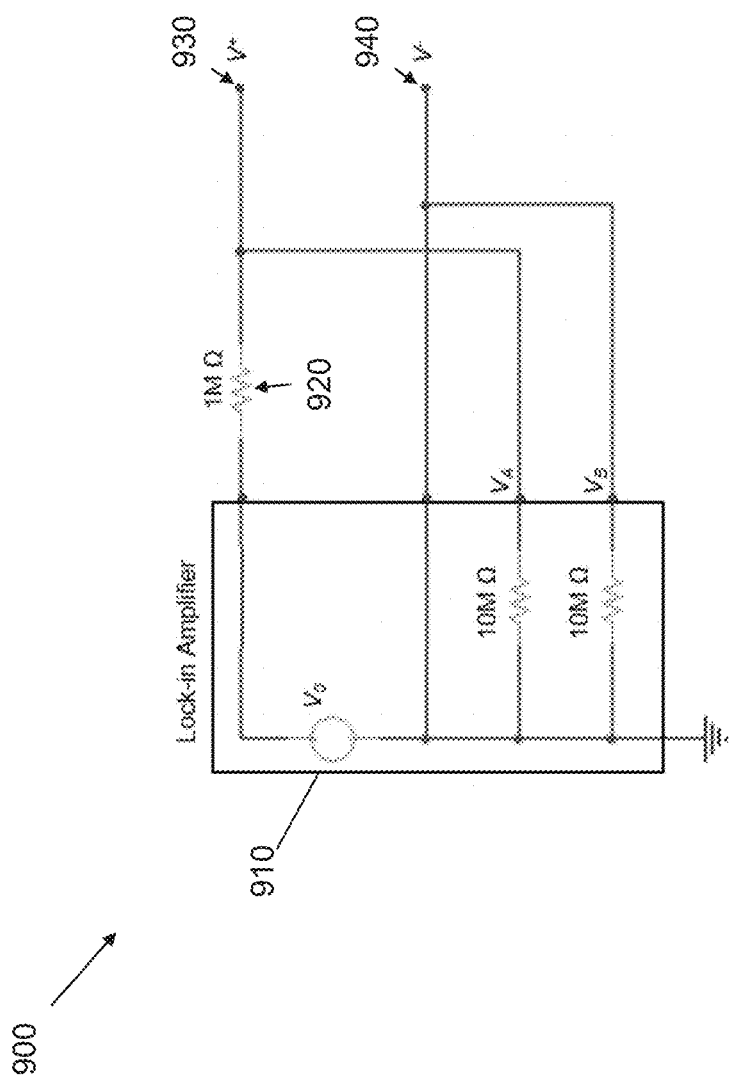
FIG. 9 illustrates an exemplary test configuration for impedance testing of an exemplary Seebeck cancellation device according to the exemplary completed circuit of FIG. 8.

FIG. 9 illustrates an exemplary test configuration for impedance testing of an exemplary Seebeck cancellation device according to the exemplary completed circuit 800. Using a Stanford Research Systems SR830 lock-in amplifier 910 acting as a current source, a 19 Hz 1 V output was used in series with a 1 MΩ series output resistor 920 to inject a constant current of 1 µA into the completed circuit 800 via V⁺ 930 and V⁻ 940. The corresponding voltage $V_m$ across the system was measured. Using the following equation Eq. 1, the resistance ($R_x$) was calculated, where $R_0$ is equal to the value of the series output resistor=1 MΩ.

$$R_x/(R_x+R_0)=V_m/1 \text{ V} \quad (1)$$

To verify correct switching behavior, the resistance of the "leads" pathway $R_L$ was subtracted from the resistance of the "sample+leads" pathway $R_{S+L}$ to isolate the sample resistance $R_S$. Sample resistance was calculated at various gate voltage $V_G$ values. Experimental results of this impedance testing are outlined below.

The following equation Eq. 2 is used to analyze the lock-in measurement data.

$$R_S = R_{S+L} - R_L \quad (2)$$

Subtraction of the "leads" pathway from the "sample+leads" pathway may result in a measurement indicative of the resistance across the sample under test.

The experimental results provided in Table 1 verify that experimentally demonstrated transistor switch 205 correctly switches between pathways. As presented in Table 1, the resistance between the "leads" pathway $R_L$ and "sample+leads" pathway $R_{S+L}$ averages to 9.98Ω with a maximum variation from this value of only +0.50%. This is very close to the resistance $R_S$ of the mock sample 700, which is nominally 10Ω. This result verifies that the complete circuit 800 switches/functions correctly, as shown in the results of Table 1. Note that the gate voltages are given by $V_{G,S+L}$ and $V_{G,L}$.

TABLE 1

| $V_{G,S+L}$ (V) | $V_{G,S}$ (V) | $R_{S+L}$ Ω | $R_L$ Ω | $R_S$ Ω |
|---|---|---|---|---|
| 0 | 0 | 247k | 247k | |
| 1 | −1 | 21.89 | 11.90 | 9.99 |
| 2 | −2 | 21.44 | 11.49 | 9.95 |
| 3 | −3 | 21.11 | 11.15 | 9.96 |
| 4 | −4 | 21.08 | 11.21 | 10.03 |

To demonstrate that the technologies described herein accurately determine the voltage across an exemplary sample 220 when no external lock-in current is applied, a Keithley 2182A nanovoltmeter was connected to the system in place of the lock-in amplifier 910. The measurement points were across $V^+$ and $V^-$ as shown in FIG. 8, and the measured voltage is denoted as $V_m$. For this test, the heater was turned on (e.g., using the heating resistors 630, 635) at voltage $V_h$. Various heater voltages $V_h$ were used to create different levels of thermoelectric noise. A measurement was taken across the "sample+leads" pathway $V_{S+L}$ by applying a positive gate voltage $V_G$ before quickly switching to a negative gate voltage $V_G$ to obtain the "leads" pathway voltage $V_L$. Using the Seebeck cancellation technique described herein, a voltage measurement extremely close to the theoretical sample voltage $V_S$ may be obtained, as shown by the results of this test presented below in Table 2.

While the resistance measurements of the system demonstrate that the switching functionality of the complete circuit 800 operate correctly, the voltage measurements demonstrate that the exemplary experimental transistor switch 205 operates correctly for its intended purpose: Seebeck cancellation. The following equation Eq. 3 was used for analysis of experimental voltage measurements.

$$V_S = V_{S+L} - V_L \quad (3)$$

Using Equation 3 and subtracting the "leads" pathway $V_L$ from the "sample+leads" pathway $V_{S+L}$, a consistent sample voltage $V_S$ that averages to 14.62 µV was obtained with a maximum fluctuation of only +1.92%. In Table 2, it is shown that different pathway measurements may result in a similar sample voltage regardless of heating or gate voltages $V_{G,S+L}$ and $V_{G,L}$. This experiment indicates that the experimentally tested transistor switch 205 operates exactly as intended and that the technologies described herein provide accurate and effective systems and methods for cancelling out thermoelectric voltages in order to obtain high fidelity measurements.

TABLE 2

| $V_h$ (V) | $V_{G,S+L}$ (V) | $V_{G,L}$ (V) | $V_{S+L}$ (uV) | $V_L$ (uV) | $V_S$ (uV) |
|---|---|---|---|---|---|
| 0.5 | 4 | −4 | 34.8 | 20.2 | 14.6 |
| 1 | 4 | −4 | 57.2 | 42.6 | 14.6 |
| 2 | 4 | −4 | 23.5 | 8.6 | 14.9 |
| 0.5 | 1 | −1 | 27.4 | 13.0 | 14.4 |
| 0.5 | 1 | −1 | 32.5 | 17.9 | 14.6 |

As an example, the technologies described herein may be applied to measurement of temperature differences in cryostats or furnaces. Measurements of temperature differences or temperature gradients within a cryostat or furnace may be performed to calibrate temperature uniformity. These are typically measured by a voltmeter as a DC voltage output of metallic thermocouple pairs. However, when such measurements are carried out within standard cryostats or furnaces which sit at a large temperature difference relative to the voltmeter at room temperature, running the wiring may be challenging. This may be because most cryostats and furnaces with feedthroughs use pre-installed leads made of a different metal than the thermocouple metal which extends to room temperature. Each metal connection with a mismatched junction of materials along the leads may generate a large DC Seebeck voltage offset given the large temperature differences under consideration. The technologies described herein may straightforwardly correct for any such residual offset voltage.

As an example, the technologies described herein may be applied to measurement of Seebeck coefficients for thermoelectric material in a cryostat. The Seebeck coefficient may be used to determine the sign of the dominant carrier in semiconductors (e.g., p-type or n-type) or as a principal property of a thermoelectric material. This may be achieved by applying a small local temperature gradient to the material inside the cryostat and measuring the resulting proportionally induced voltage. When this measurement is performed inside a cryostat, the measured DC voltage may not be reliable given the various electrical lead couplings of various metals at various temperatures built into the cryostat, whose temperatures themselves drift slowly with time, even when the cryostat temperature is stable. The Seebeck voltage offset induced from the wiring may compromise the signal in this case. The technologies described herein may cancel out the Seebeck effect from the wiring and facilitate accurate measurement of the sample's intrinsic Seebeck voltage.

As an example, the technologies described herein may be applied to measurement of low-level electrical voltage values with a DC readout. Many standard experimental characterizations for electronic materials have low-level DC signals such as the Hall effect or longitudinal resistance when characterizing bulk materials or non-linear current-voltage characteristics for p-n junction diodes and other electronic devices. For high precision measurements, thermal differences between the warm input terminals of an electronic device and the nominal room temperature sample may induce a small drifting offset with thermal fluctuations, because the DC readout may then include the Seebeck voltage offset on the electrical leads as described above. The technologies described herein may cancel out this offset.

As an example, the technologies described herein may be applied to correct for thermal drift in long-term DC measurements. At times when a voltmeter performs DC measurements for a long period of time, such as for a feedback circuit for a thermal stabilizing heater, there may be slowly fluctuating temperatures in the intervening region between the cryostat cell and the room-temperature voltmeter, even though the cryostat cell temperature is stable and the ambient room temperature is stable. These slow fluctuations in the intervening region may induce offset Seebeck voltage signals on the electrical leads. The technologies described herein may cancel out this offset.

As an example, the technologies described herein may be applied to correct for Seebeck voltage in scanning tunneling spectroscopy. Scanning tunneling spectroscopy is a technique in which an electrically conducting sample and a sharp metal tip are brought together within nanometers of each other and a DC voltage is applied. The resulting current versus voltage characteristic is evaluated to understand the sample material's properties. The experiment may be performed at millikelvin temperature to avoid the influence of thermal excitations. In these experiments, there may be a large temperature difference between the electrical readout equipment and the sample. In addition, the electrical path includes numerous dissimilar materials coupled together. A Seebeck voltage along the leads that may result from this combination may be detrimental to the accuracy of measurement results. Therefore, a Seebeck switch according to the technologies described herein (e.g., the transistor switch 205) may be used to measure the exact signal voltage without the false Seebeck voltage component induced on the leads.

Figure 10:
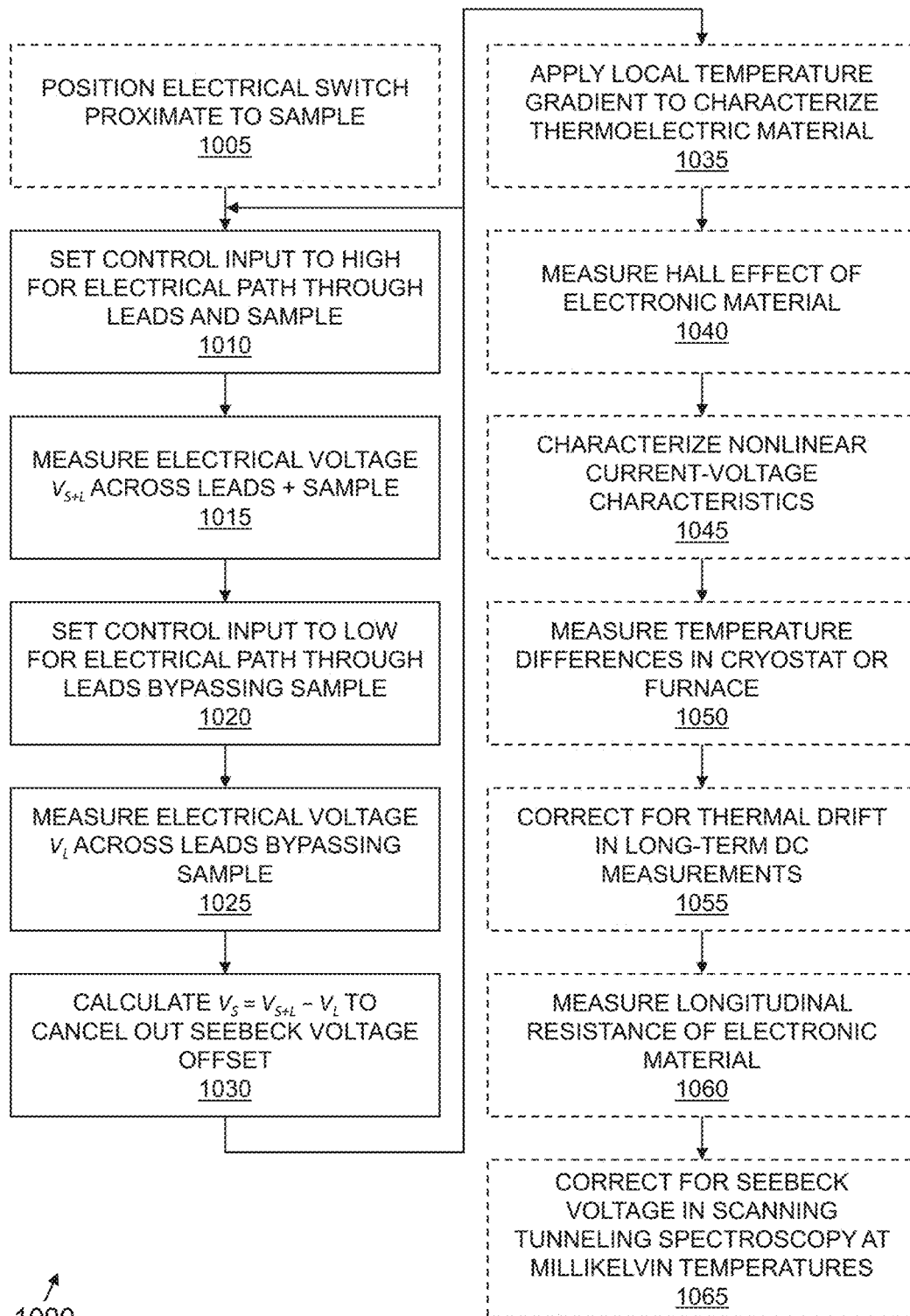
FIG. 10 shows a flow chart that illustrates an exemplary method for performing precision DC voltage measurements.

FIG. 10 shows a flowchart that illustrates an exemplary method 1000 for performing precision DC voltage measurements. The method 1000 may be performed by a computing processor executing a series of instructions stored in a memory or on a non-transitory machine-readable memory. An example of the computing processor may include the digital controller 260. Other computing processors may also perform the method 1000 in various embodiments. The method 1000, in various embodiments, may be implemented with fewer or more steps illustrated and described in this example embodiment shown in FIG. 10. Some procedures in the example of the method 1000 shown in FIG. 10 may be substituted with others in various examples of the method 1000.

In an operation 1005, an electrical switch is positioned proximate to a sample under study across which an electrical voltage is to be measured. By positioning the electrical switch proximate the sample under study, a temperature of the electrical switch may be about the same as the sample under study during the voltage measurement.

In an operation 1010, a control input $V_G$ of an electrical switch is set into a HIGH state that establishes a first electrical conducting path from a positive terminal of an electrical measurement apparatus through one or more electrical leads and an electrically-conductive sample to a negative terminal of the electrical measurement apparatus. Setting the control input $V_G$ of the electrical switch into a HIGH state may include setting the gates of both a PMOS transistor and an NMOS transistor to a voltage value $V_G$ corresponding to the HIGH state, thereby creating an electrical conduction path through an n-channel of the NMOS transistor between the electrical measurement apparatus and the electrically-conductive sample. Setting the control input $V_G$ of the electrical switch into a HIGH state may include setting the gates of both a PMOS transistor and an NMOS transistor to a voltage value $V_G$ corresponding to the HIGH state, thereby creating an electrical conduction path through an n-channel of the NMOS transistor between the electrical measurement apparatus and the electrically-conductive sample.

In an operation 1015, while the control input $V_G$ of the switch is in the HIGH state, a voltage $V_{S+L}$ across all of the sample and the one or more electrical leads is measured. The measuring the voltage $V_{S+L}$ may be performed by a voltmeter. The measuring the voltage $V_{S+L}$ may include storing the measured voltage $V_{S+L}$ in a memory.

In an operation 1020, a control input $V_G$ of an electrical switch is set into a LOW state that establishes a second electrical conducting path from the positive terminal of an electrical measurement apparatus through the one or more electrical leads to the negative terminal of the electrical measurement apparatus bypassing the sample. Setting the control input $V_G$ of the electrical switch into a LOW state may include setting the gates of both a p-channel MOSFET and an n-channel MOSFET to a voltage value $V_G$ corresponding to the LOW state, thereby creating an electrical conduction path through a p-channel of the p-channel MOSFET between the positive terminal and the negative terminal of the electrical measurement apparatus bypassing the electrically-conductive sample. Setting the control input $V_G$ of the electrical switch into a LOW state may include setting the gates of both a p-channel MOSFET and an n-channel MOSFET to a voltage value $V_G$ corresponding to the LOW state, thereby creating an electrical conduction path through a p-channel of the p-channel MOSFET between the positive terminal and the negative terminal of the electrical measurement apparatus bypassing the electrically-conductive sample.

In an operation 1025, while the control input $V_G$ of the switch is in the LOW state, a voltage $V_L$ across the one or more electrical leads is measured. The measuring the voltage $V_L$ may be performed by a voltmeter. The measuring the voltage $V_L$ may include storing the measured voltage $V_L$ in a memory.

In an operation 1030, calculations according to the equation $V_S = V_{S+L} - V_L$ are performed to determine a precision DC voltage measurement of a voltage across the sample $V_S$ in the absence of Seebeck voltage offsets contributed by the one or more electrical leads. Performing the calculations according to the equation $V_S = V_{S+L} - V_L$ may include retrieving the measured voltage values $V_{S+L}$ and $V_L$ from a memory prior to performing the calculations.

In an operation 1035, the sample may be characterized as a thermoelectric material in a cryostat by applying a local temperature gradient to the sample while positioned inside the cryostat and measuring proportionally induced voltage.

In an operation 1040, the Hall effect of an electronic material as the sample may be measured.

In an operation 1045, nonlinear current-voltage characteristics for an electronic device as the sample may be characterized.

In an operation 1050, temperature differences in a cryostat or furnace may be measured.

In an operation 1055, thermal drift may be corrected for in long-term DC measurements.

In an operation 1060, longitudinal resistance of an electronic material may be measured.

In an operation 1065, Seebeck voltage may be corrected for in scanning tunneling spectroscopy at millikelvin temperatures.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A system for performing precision DC voltage measurements comprising:
   an electrically-conductive switch operable to switch between a first mode that provides a conducting path between a port a and a port b, to a second mode that provides a conducting path between the port a and a port c, based on a value of a control input $V_G$ being in a HIGH state or a LOW state, respectively;
   a measurement apparatus operable to perform voltage measurements across an electrically-conductive sample electrically connected with one or more sample leads between the port a and the port b of the switch, a positive terminal of the measurement apparatus electrically coupled to the port c of the switch via one or more first measurement leads, and a negative terminal of the measurement apparatus electrically coupled to the port b of the switch via one or more second measurement leads; and
   an electronic controller device operable to:
      alternately set the control input $V_G$ of the switch into the HIGH state and the LOW state;
      synchronize timing of setting the control input $V_G$ with corresponding voltage measurements performed by the measurement apparatus to measure:

a voltage $V_{S+L}$ across all of the sample and the one or more first measurement leads, the one or more second measurement leads, and/or the one or more sample leads when the control input $V_G$ is in the HIGH state, and a voltage $V_L$ across the one or more first measurement leads, the one or more second measurement leads, and/or the one or more sample leads when the control input $V_G$ is in the LOW state; and perform calculations according to the equation $V_S=V_{S+L}-V_L$ to determine a precision DC voltage measurement of a voltage across the sample $V_S$ in the absence of Seebeck voltage offsets contributed by the one or more first measurement leads, the one or more second measurement leads, and/or the one or more sample leads between the measurement apparatus and the sample.

2. The system of claim 1, wherein the electrically-conductive switch comprises a p-type MOSFET and an n-type MOSFET having their respective drains electrically connected together and to the port c, the source of the n-type MOSFET electrically connected to the port a, the source of the p-type MOSFET electrically connected to the port b, and the gates of the n-type MOSFET and p-type MOSFET electrically connected together and to the control input $V_G$.

3. The system of claim 1, further comprising a control voltage source electrically connected to the control input $V_G$, the control voltage source controllable by the electronic controller device to set the control input $V_G$ to a LOW state or a HIGH state.

4. The system of claim 1, wherein:
the HIGH state corresponds to a voltage value between a minimum positive value and a maximum positive value corresponding to an operational range of an n-channel enhancement mode MOSFET device; and
the LOW state corresponds to a voltage value between a maximum negative value and a minimum negative value corresponding to an operational range of a p-channel enhancement mode MOSFET device.

5. The system of claim 1, wherein:
the HIGH state corresponds to a voltage value between a threshold positive value and a maximum positive value corresponding to an operational range of an n-channel depletion mode MOSFET device; and
the LOW state corresponds to a voltage value between a zero value and a threshold positive value corresponding to an operational range of a p-channel enhancement mode MOSFET device.

6. The system of claim 1, wherein the electrically-conductive switch includes an integrated circuit mounted on a silicon substrate and positionable proximate to the electrically-conductive sample.

7. A system for performing precision DC voltage measurements comprising:
a transistor switch including a PMOS transistor and an NMOS transistor, the drain of the NMOS transistor electrically connected to the drain of the PMOS transistor and a port c of the switch, the source of the NMOS transistor electrically connected to a port a of the switch, the source of the PMOS transistor electrically connected to a port b of the switch, and the gates of both the NMOS transistor and the PMOS transistor electrically connected to a control input of the switch;
a measurement apparatus remotely controllable by a computing device to perform voltage measurements across an electrically conductive sample electrically connected with one or more sample leads between the port a and the port b of the switch, a positive terminal of the measurement apparatus electrically coupled to the port c of the switch via one or more first measurement leads, and a negative terminal of the measurement apparatus electrically coupled to the port b of the switch via one or more second measurement leads;
a non-transitory computer-readable memory comprising instructions; and
a computing processor configured to execute the instructions which, when executed, cause the processor to:
alternately set the control input $V_G$ of the switch into a HIGH state and a LOW state;
synchronize timing of setting the control input $V_G$ with corresponding voltage measurements performed by the measurement apparatus to measure:
a voltage $V_{S+L}$ across all of the sample and the one or more first measurement leads, the one or more second measurement leads, and/or the one or more sample leads when the control input $V_G$ is in the HIGH state, and
a voltage $V_L$ across the one or more first measurement leads, the one or more second measurement leads, and/or the one or more sample leads when the control input $V_G$ is in the LOW state; and
perform calculations according to the equation $V_S=V_{S+L}-V_L$ to determine a precision DC voltage measurement of a voltage across the sample $V_S$ in the absence of Seebeck voltage offsets contributed by the one or more first measurement leads, the one or more second measurement leads, and/or the one or more sample leads between the measurement apparatus and the sample.

8. The system of claim 7, further comprising a control voltage source electrically connected to the control input $V_G$, the control voltage source controllable by the electronic controller device to set the control input $V_G$ to a LOW state or a HIGH state.

9. The system of claim 7, wherein:
the HIGH state corresponds to a voltage value between a minimum positive value and a maximum positive value corresponding to an operational range of the NMOS device; and
the LOW state corresponds to a voltage value between a maximum negative value and a minimum negative value corresponding to an operational range of the PMOS device.

10. The system of claim 7, wherein:
the HIGH state corresponds to a voltage value between a threshold positive value and a maximum positive value corresponding to an operational range of the NMOS device; and
the LOW state corresponds to a voltage value between a zero value and a threshold positive value corresponding to an operational range of the PMOS device.

11. The system of claim 7, wherein the transistor switch includes an integrated circuit mounted on a silicon substrate and positionable proximate to the electrically-conductive sample.

12. A method for performing precision DC voltage measurements comprising:
setting a control input $V_G$ of an electrical switch into a HIGH state that establishes a first electrical conducting path from a positive terminal of an electrical measurement apparatus through one or more electrical leads and an electrically-conductive sample to a negative terminal of the electrical measurement apparatus;

while the control input $V_G$ of the switch is in the HIGH state, measuring a voltage $V_{S+L}$ across all of the sample and the one or more electrical leads;

setting the control input $V_G$ of the switch into a LOW state that establishes a second electrical conducting path from the positive terminal of an electrical measurement apparatus through the one or more electrical leads to the negative terminal of the electrical measurement apparatus bypassing the sample;

while the control input $V_G$ of the switch is in the LOW state, measuring a voltage $V_L$ across the one or more electrical leads; and performing calculations according to the equation $V_S = V_{S+L} - V_L$ to determine a precision DC voltage measurement of a voltage across the sample $V_S$ in the absence of Seebeck voltage offsets contributed by the one or more electrical leads.

13. The method of claim 12, wherein the measuring the voltage $V_{S+L}$ and the measuring the voltage $V_L$ are performed by a voltmeter and comprise storing the measured voltage $V_{S+L}$ and the measured voltage $V_L$ in a memory, respectively.

14. The method of claim 12, wherein performing the calculations according to the equation $V_S = V_{S+L} - V_L$ comprises retrieving the measured voltage values $V_{S+L}$ and $V_L$ from a memory prior to performing the calculations.

15. The method of claim 12, wherein setting the control input $V_G$ of the electrical switch into a HIGH state comprises setting the gates of both a PMOS transistor and an NMOS transistor to a voltage value $V_G$ corresponding to the HIGH state, thereby creating an electrical conduction path through an n-channel of the NMOS transistor between the electrical measurement apparatus and the electrically-conductive sample.

16. The method of claim 12, wherein setting the control input $V_G$ of the electrical switch into a LOW state comprises setting the gates of both a p-channel MOSFET and an n-channel MOSFET to a voltage value $V_G$ corresponding to the LOW state, thereby creating an electrical conduction path through a p-channel of the p-channel MOSFET between the positive terminal and the negative terminal of the electrical measurement apparatus bypassing the electrically-conductive sample.

17. The method of claim 12, further comprising positioning the electrical switch proximate the electrically-conductive sample and at a same temperature as the electrically-conductive sample.

18. The method of claim 12, further comprising characterizing the sample as a thermoelectric material in a cryostat by applying a local temperature gradient to the sample while positioned inside the cryostat and measuring proportionally induced voltage.

19. The method of claim 12, further comprising measuring the Hall effect of an electronic material as the sample.

20. The method of claim 12, further comprising characterizing nonlinear current-voltage characteristics for an electronic device as the sample.

* * * * *